US008928369B1

(12) United States Patent
Jaeger et al.

(10) Patent No.: US 8,928,369 B1
(45) Date of Patent: Jan. 6, 2015

(54) LOW POWER LOCAL OSCILLATOR QUADRATURE GENERATOR (71) Applicant: Futurewei Technologies, Inc., Plano, TX (US)

(72) Inventors: Kent Jaeger, Cary, IL (US); Lawrence E. Connell, Naperville, IL (US); Daniel P. McCarthy, Elk Grove Village, IL (US); Brian T. Creed, Batavia, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/955,197

(22) Filed: Jul. 31, 2013

(51) Int. Cl.
  *H03K 21/10* (2006.01)
  *H03B 19/00* (2006.01)
  *H03K 3/353* (2006.01)

(52) U.S. Cl.
  CPC .................................... *H03K 3/353* (2013.01)
  USPC ............ 327/115; 331/108 A; 331/57; 331/45; 331/74

(58) Field of Classification Search
  USPC ..................... 331/108 A, 57, 45, 74; 327/115
  See application file for complete search history.

(56) References Cited

U.S. PATENT DOCUMENTS

| 8,237,485 | B2 * | 8/2012 | Meng et al. | 327/295 |
| 8,487,669 | B2 * | 7/2013 | Hesen et al. | 327/115 |
| 8,502,573 | B2 * | 8/2013 | Tsai | 327/115 |

OTHER PUBLICATIONS

Ghilioni, A., et al. "A 6.5mW Inductorless CMOS Frequency Divider-by-4 Operating up to 70GHz," IEEE International Solid-State Circuits Conference, ISSCC 2011/Session 16/mm-WAVE Design Techniques/16.3, 3 pgs.
Connell, L., et al. "A CMOS Broadband Tuner IC," ISSCC 2002 Visuals Supplement, ISSCC 2002/Session 24/RF Systems/24.3, 3 pgs.
Lu, I. S-C., et al. "A SAW-less GSM/GPRS/EDGE Receiver Embedded in a 65nm CMOS SoC," IEEE International Solid-State Circuits Conference, ISSCC 2011/Session 21/Cellular/21.1, 3 pgs.

* cited by examiner

*Primary Examiner* — Joseph Chang
(74) *Attorney, Agent, or Firm* — Conley Rose, P.C.; Grant Rodolph; William H. Dietrich (57) ABSTRACT An apparatus comprising a frequency divider comprising a first latch and a second latch coupled to the first latch in a toggle-flop configuration, and an output circuit comprising a first p-channel transistor, wherein the gate of the first p-channel transistor is configured to receive a clock signal, a first n-channel transistor, wherein the gate of the first n-channel transistor is coupled to the first latch, a second n-channel transistor connected in series with the first p-channel transistor and the first n-channel transistor and wherein the gate of the second n-channel transistor is configured to receive the clock signal, a second p-channel transistor, wherein the gate of the second p-channel transistor is configured to receive the clock signal, and a third n-channel transistor in series with the second p-channel transistor and the second n-channel transistor, wherein the output circuit is configured to generate a pair of in-phase reference signals.

20 Claims, 5 Drawing Sheets

LOW POWER LOCAL OSCILLATOR QUADRATURE GENERATOR

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Quadrature generators may be used in mobile wireless communication devices, such as cell phones or smart phones, as part of, as an example, a local oscillator (LO) circuit. Given the constraints on power consumption of modern mobile wireless communication devices it is desirable to find new ways to reduce power consumption without sacrificing performance. An improved quadrature waveform generator circuit configuration is one means for reducing power consumption of a quadrature generator and therefore a communication device.

SUMMARY

In one embodiment, the disclosure includes an apparatus comprising a frequency divider comprising a first latch configured to receive a clock signal and a complement of the clock signal and to generate a first latch first output and a first latch second output, and a second latch coupled to the first latch in a toggle-flop configuration, wherein the second latch is configured to receive the clock signal and the complement of the clock signal and to generate a second latch first output and a second latch second output, a first output circuit comprising a first p-channel transistor, wherein the gate of the first p-channel transistor is configured to receive the clock signal, a first n-channel transistor, wherein the gate of the first n-channel transistor is configured to receive the first latch first output, a second n-channel transistor, wherein the second n-channel transistor is in series with the first p-channel transistor and the first n-channel transistor, and wherein the gate of the second n-channel transistor is configured to receive the clock signal, a second p-channel transistor, wherein the gate of the second p-channel transistor is configured to receive the clock signal, and a third n-channel transistor in series with the second p-channel transistor, wherein the second p-channel transistor and the third n-channel transistor are in parallel with the first p-channel transistor and the first n-channel transistor and wherein the gate of the third n-channel transistor is configured to receive the first latch second output, and a second output circuit configured to receive the complement of the clock signal, the second latch first output, and the second latch second output, wherein the first output circuit is configured to generate a first in-phase reference signal and a second in-phase reference signal and the second output circuit is configured to generate a first quadrature signal and a second quadrature signal.

In another embodiment, the disclosure includes an apparatus comprising an output circuit comprising a first p-channel transistor, wherein the gate of a first p-channel transistor is configured to receive a clock signal, a first n-channel transistor, wherein the drain of the first p-channel transistor is directly connected to the drain of the first n-channel transistor, wherein the gate of the first n-channel transistor is configured to receive a frequency divider first output signal, and wherein the source of the first n-channel transistor is directly connected to the drain of a second n-channel transistor, wherein the gate of the second n-channel transistor is configured to receive the clock signal, and a second p-channel transistor, wherein the gate of a second p-channel transistor is configured to receive the clock signal, and a third n-channel transistor, wherein the drain of the second p-channel transistor is directly connected to the drain of the third n-channel transistor, wherein the source of the third n-channel transistor is directly connected to the source of the first n-channel transistor, and wherein the gate of the third n-channel transistor is configured to receive a frequency divider second output signal, wherein the output circuit is configured to generate a first quadrature signal and a second quadrature signal or a first in-phase reference signal and a second in-phase reference signal.

In yet another embodiment, the disclosure includes a method comprising receiving a clock signal by a frequency divider and an output circuit, wherein the frequency divider comprises a latch, wherein the latch receives the clock signal, and wherein the latch generates a first latch output signal and a second latch output signal, generating a first output signal and second output signal, by an output circuit, based on the clock signal, the first latch output signal, and the second latch output signal, wherein the output circuit comprises a first p-channel transistor, wherein the gate of a first p-channel transistor is configured to receive the clock signal, a first n-channel transistor, wherein the drain of the first p-channel transistor is directly connected to the drain of the first n-channel transistor, wherein the gate of the first n-channel transistor is configured to receive the first latch output signal, a second n-channel transistor, wherein the gate of the second n-channel transistor is configured to receive the clock signal, and wherein the source of the first n-channel transistor is directly connected to the drain of the second n-channel transistor, a second p-channel transistor, wherein the gate of a second p-channel transistor is configured to receive the clock signal, a third n-channel transistor, wherein the drain of the second p-channel transistor is directly connected to the drain of the third n-channel transistor, wherein the source of the third n-channel transistor is directly connected to the source of the first n-channel transistor, and wherein the gate of the third n-channel transistor is configured to receive the second latch output signal, a first inverter directly connected to the drain of the first p-channel transistor, wherein an output of the first inverter is configured to generate the first output signal, and a second inverter directly connected to the drain of the second p-channel transistor, wherein an output of the second inverter is configured to generate the second output signal.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein are embodiments of an improved quadrature waveform output circuit generally configured to provide a quadrature waveform signal while reducing capacitive loading on one or more clock buffers and thereby reducing power consumption.

Figure 1:
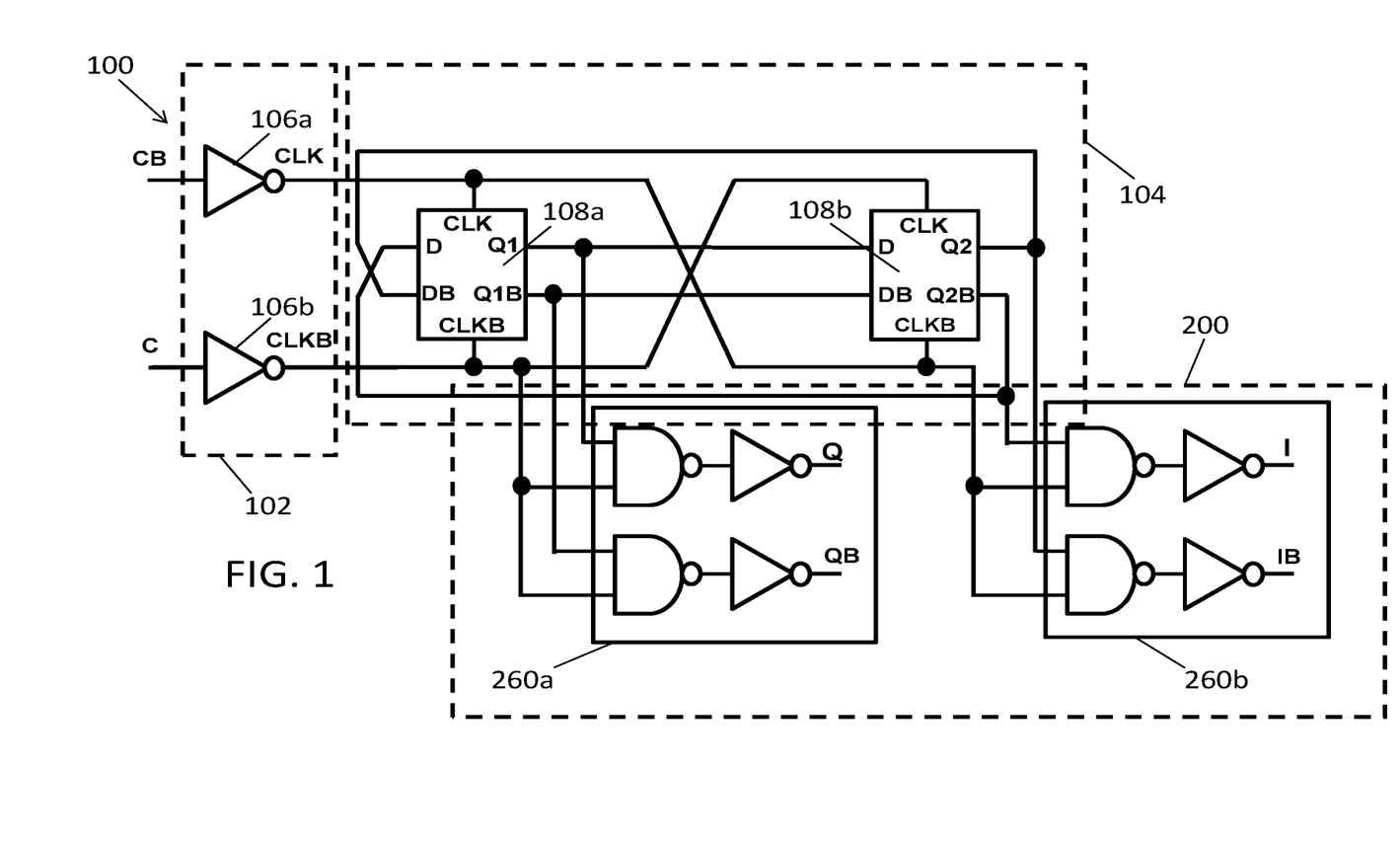
FIG. 1 is a schematic diagram of an embodiment of a quadrature generator.

FIG. 1 is a schematic diagram of an embodiment of a quadrature generator 100. In such an embodiment, the quadrature generator 100 comprises an input buffer 102, a frequency divider 104, and a quadrature waveform generator 200. The input buffer 102 comprises a pair of inverters and may also be referred to as "clock buffers" (e.g., a first clock buffer 106a and a second clock buffer 106b). The input buffer 102 is generally configured to receive an input clock signal (C) and an input clock bar (CB) signal and to distribute a clock (CLK) signal and a clock bar (CLKB) signal to one or more components of the quadrature generator 200. For example, the first clock buffer 106a and the second clock buffer 106b may be configured to receive the input CB signal and the input C signal and to output the CLK signal and the CLKB signal, respectively. It is noted that one way to generate a CLKB signal is to pass the CLK signal through an inverter, which may introduce a small time delay between transitions of the CLK signal and the CLKB signal. Such a small time delay would not upset the operation of the quadrature generator 100. The input C signal and the input CB signal may be periodic signals, such as sinusoidal ("sine") waves or square waves. If the input C signal and the input CB signal are sine waves, the clock buffers 106a, 106b may be employed to "square up" the signal, for example, to create output signals that are square waves. Alternatively, the clock buffers 106a, 106b are optional if the input C signal and the input CB signal are square waves.

In an embodiment, the frequency divider 104 is configured to divide an input frequency by different amounts (e.g., one-half frequency, one-fourth frequency, and so on). For example, two latches connected in a feedback shift register configuration can provide an output signal with a frequency that is one-half the input frequency. In the embodiment of FIG. 1, the frequency divider 104 comprises two latches (e.g., a first latch 108a and a second latch 108b) configured in a feedback or toggle-flop configuration. In an embodiment, the latches 108a, 108b may be as described in U.S. patent application Ser. No. 13/934,306 filed Jul. 3, 2013 and entitled "Low Power High Speed Quadrature Generator," by Lawrence Connell, et. al., which is hereby incorporated by reference in its entirety. Alternatively, any other suitable latch may be employed as would be appreciated by one of ordinary skill in the art upon viewing this disclosure. In the embodiment of FIG. 1, each latch 108a, 108b is configured to output a first output signal (e.g., an output signal Q1 or an output signal Q2) and a second output signal (e.g., an output signal Q1B or an output signal Q2B), respectively.

In an embodiment, the quadrature waveform generator 200 is configured to receive the first output signal and the second output signal from each of the latches 108a, 108b and to output an in-phase reference waveform signal, for example, a "in-phase signal" (e.g., an output signal I and/or an output signal IB) and/or a quadrature waveform signal, for example, a "quadrature signal" (e.g., an output signal Q and/or an output signal QB). Each of the output signals (e.g., the output signal Q, the output signal QB, the output signal I, and the output signal IB) may have a duty cycle of about 25% (i.e., each output is "high" approximately 25% of the time and "low" 75% of the time within a period), assuming the CLK signal and the CLKB signal have a duty cycle of 50%. Additionally, in an embodiment, the output signals are high during approximately non-overlapping time intervals except that they may overlap during rise and fall transitions. Starting with the I signal, Q may be delayed 90 degrees out of phase with I, then IB will be delayed 90 degrees out of phase with Q, and then QB will be delayed 90 degrees out of phase with IB.

In the embodiment of FIG. 1, the quadrature waveform generator 200 comprises a plurality of output circuits (e.g., a first output circuit 260a and a second output circuit 260b). Each of the output circuits 260a, 260b comprises a NAND gate followed by an inverter as shown in FIG. 1. In such an embodiment, the first output circuit 260a is configured to receive the first output signal (e.g., the output signal Q1) from the first latch 108a, receive the second output signal (e.g., the output signal Q1B) from the first latch 108a, a first clock signal (e.g., the CLK signal or the CLKB signal) and to output a first quadrature signal (e.g., an output signal Q). The second output circuit 260b is configured to receive the first output signal (e.g., the output signal Q2) from the second latch 108b, the second output signal (e.g., the output signal Q2B) from the second latch 108b, a complement to the first clock signal (e.g., the CLK signal or the CLKB signal) and to output a first in-phase signal (e.g., an output signal I).

Figure 2:
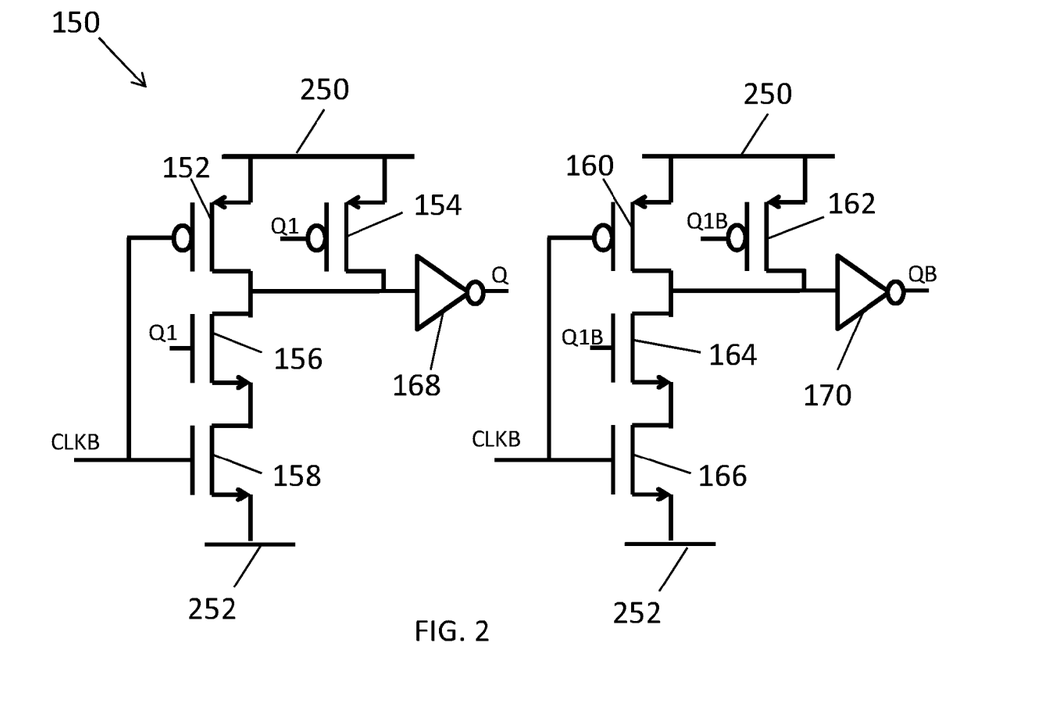
FIG. 2 is a schematic diagram of an embodiment of a conventional output circuit.

FIG. 2 is schematic diagram of an embodiment of a conventional output circuit 150. In such an embodiment, the conventional output circuit 150 comprises a first NAND gate in series with a first inverter 168 and a second NAND gate in series with a second inverter 170. For example, the first NAND gate comprises a first p-channel transistor 152 (e.g., a p-channel metal-oxide-semiconductor field-effect transistor (MOSFET) or PMOS) in parallel with a second p-channel transistor 154 and in series with a first n-channel transistor 156 (e.g., an n-channel MOSFET or NMOS) and a second n-channel transistor 158. The conventional output circuit 150 may be configured as 260a and/or 260b as shown in FIG. 1. For illustrative purposes the conventional output circuit 150 is labeled with the same inputs and outputs as 260a in FIG. 1 (the conventional output circuit 150 used for output circuit 260b would replace labels CLKB with CLK, Q1 with Q2B, Q1B with Q2, Q with I and QB with IB). For example, the gate of the first p-channel transistor 152 is configured to receive a complement of a first clock signal (e.g., the CLKB signal), the source of the first p-channel transistor 152 is coupled to a positive voltage supply 250, and a drain of the first p-channel transistor 152 is coupled to a drain of the first n-channel transistor 156 and an input of the first inverter 168. Additionally, the second p-channel transistor 154 is configured such that its gate is configured to receive a first signal (e.g., output signal Q1), its source is coupled to the positive voltage supply 250, and its drain is coupled to the drain of the first n-channel transistor 156. Additionally, a gate of the first n-channel transistor 156 is configured to receive the first signal (e.g., the output signal Q1), and a source of the first n-channel transistor 156 is coupled to a drain of the second n-channel transistor 158. Further, a gate of the second n-channel transistor 158 is configured to receive the complement of the first clock signal (e.g., the CLKB signal) and a source of the second n-channel transistor 158 is coupled to a voltage supply ground 252.

Additionally, the second NAND gate may comprise a third p-channel transistor 160 in parallel with a fourth p-channel transistor 162 and in series with a third n-channel transistor 164 and a fourth n-channel transistor 166. For example, the gate of the third p-channel transistor 160 is configured to receive the complement of a first clock signal (e.g., the CLKB signal), the source of the third p-channel transistor 160 is coupled to a positive voltage supply 250, and a drain of the third p-channel transistor 160 is coupled to a drain of the third n-channel transistor 164 and an input of the second inverter 170. Additionally, the fourth p-channel transistor 162 is configured such that its gate is configured to receive a second signal (e.g., output signal Q1B), its source is coupled to the positive voltage supply 250, and its drain is coupled to the drain of the third re-channel transistor 164. Additionally, a gate of the third n-channel transistor 164 is configured to receive the second signal (e.g., the second output signal Q1B), and a source of the third n-channel transistor 164 is coupled to a drain of the fourth n-channel transistor 166. Further, a gate of the fourth n-channel transistor 166 is configured to receive the complement of the first clock signal (e.g., the CLKB signal) and a source of the fourth n-channel transistor 166 is coupled to the voltage supply ground 252.

Figure 3:
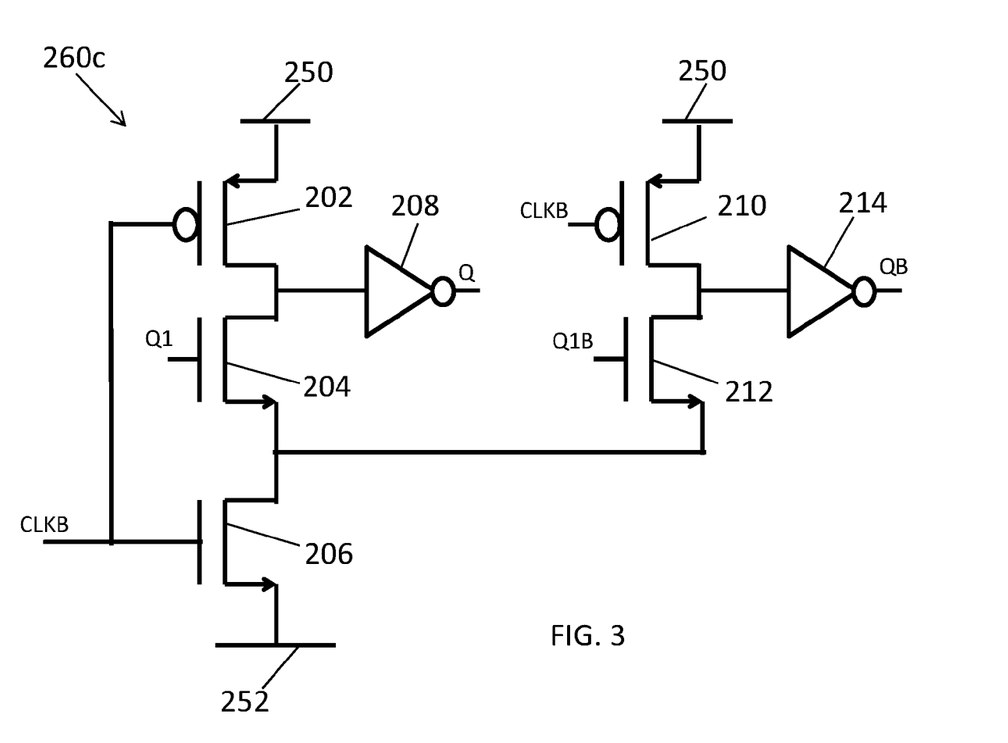
FIG. 3 is a schematic diagram of an embodiment of an output circuit.

FIG. 3 is a schematic view of an embodiment of an output circuit 260c. The output circuit 260c comprises a first NAND gate coupled to a first inverter 208 and a second NAND gate coupled to a second inverter 214. In the embodiment of FIG. 3, the first NAND gate comprises a first p-channel transistor 202 in series with an n-channel transistor 204 and a second n-channel transistor 206. The operation of n-channel (e.g., NMOS) and p-channel (e.g., PMOS) transistors is well known to a person having ordinary skill in the art. The output circuit 260c may be configured as 260a and/or 260b as shown in FIG. 1. For illustrative purposes the output circuit 260c is labeled with the same inputs and outputs as 260a in FIG. 1 (the output circuit 260c used for output circuit 260b would replace labels CLKB with CLK, Q1 with Q2B, Q1B with Q2, Q with I and QB with IB). For example, the output circuit 260c is configured such that a gate of the first p-channel transistor 202 is configured to receive the complement of the first clock signal (e.g., the CLKB signal), a source of the first p-channel transistor 202 is coupled to a positive voltage supply 250, and a drain of the first p-channel transistor 202 is coupled to a drain of the first n-channel transistor 204 and an input of the first inverter 208. The first inverter 208 is configured to output a first output signal (e.g., the output signal Q). Additionally, a gate of the first n-channel transistor 204 is configured to receive a first output signal (e.g., the output signal Q1) of a latch (e.g., latch 108a), and a source of the first n-channel transistor 204 is coupled to a drain of the second n-channel transistor 206. A gate of the second n-channel transistor 206 is configured to receive the complement of the first clock signal (e.g., the CLKB signal) and a source of the second n-channel transistor 206 is coupled to the voltage source ground 252.

Additionally, a second p-channel transistor 210 in series with a third n-channel transistor 212 is in parallel with the series combination of the first p-channel transistor 202 and the first n-channel transistor 204. For example, a gate of the second p-channel transistor 210 is configured to receive the complement of the first clock signal (e.g., the CLKB signal), a source of the second p-channel transistor 210 is coupled to the positive voltage supply 250, and a drain of the second p-channel transistor 210 is coupled to a drain of the third n-channel transistor 212 and an input of the second inverter 214. The second inverter 214 is configured to output a second output signal (e.g., the output signal QB). Additionally, a gate of the third n-channel transistor 212 is configured to receive a second output signal (e.g., the output signal Q1B) of a latch (e.g., latch 108a), and a source of the third n-channel transistor 212 is coupled to the drain of the second re-channel transistor 206.

Figure 4:
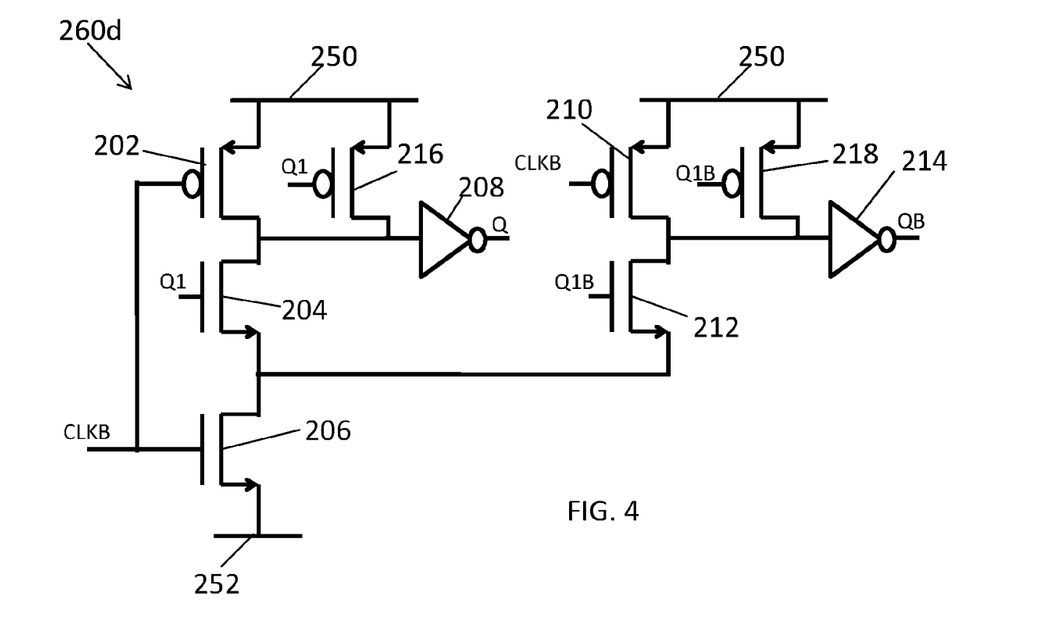
FIG. 4 is a schematic diagram of another embodiment of an output circuit.

FIG. 4 is a schematic diagram of an alternative embodiment of an output circuit 260d. Similarly, the output circuit 260d may be configured as 260a and/or 260b as shown in FIG. 1. For illustrative purposes the output circuit 260d is labeled with the same inputs and outputs as 260a in FIG. 1 (the output circuit 260d used for output circuit 260b would replace labels CLKB with CLK, Q1 with Q2B, Q1B with Q2, Q with I and QB with IB). In such an embodiment, the output circuit 260d comprises the configuration of output circuit 260c (as shown in FIG. 3) and further comprises a third p-channel transistor 216 in parallel with the first p-channel transistor 202. For example, the third p-channel transistor 216 is configured such that a gate is configured to receive the first output signal (e.g., output signal Q1) of a latch (e.g., latch 108a), a source is coupled to the positive voltage supply 250, and a drain is coupled to the drain of the first p-channel transistor 202 and the input of the first inverter 208. Additionally, the output circuit 260d comprises a fourth p-channel transistor 218 in parallel with the second p-channel transistor 210. For example, the fourth p-channel transistor 218 is configured such that its gate is configured to receive the second output signal (e.g., output signal Q1B) of a latch (e.g., latch 108a), its source is coupled to the positive voltage supply 250, and its drain is coupled to the drain of the second p-channel transistor 210 and the input of the second inverter 214.

Additionally, the output circuit 260c, 260d may be configured such that in response to a predetermined configuration of input signals the output circuit 260c, 260d is forced into a known state (i.e., having a known output signal), for example, a standby mode.

Figure 5:
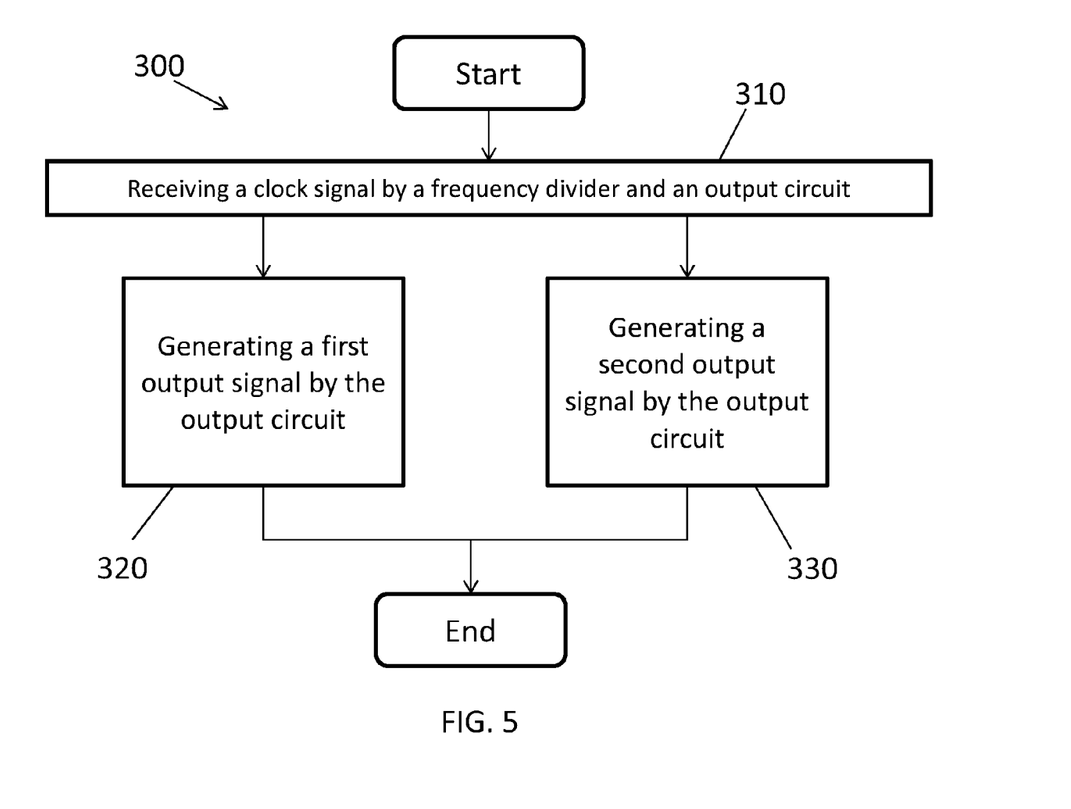
FIG. 5 is an embodiment of a method of generating a pair of output signals.

FIG. 5 is an embodiment of a method 300 for generating a pair of output signals. The embodiment 300 begins in block 310. In block 310, a first clock signal (e.g., the CLK signal) and a complement of the first clock signal (e.g., the CLKB signal) is received by a frequency divider, such as frequency divider 104 in FIG. 1. Additionally, the complement of the first clock signal is received by an output circuit, such as output circuit 260c or output circuit 260d, as shown in FIGS. 3 and 4, respectively. Thus, the frequency divider and the output circuit may be coupled as shown in FIG. 1 with an output circuit configured as shown in FIGS. 3 and 4 (i.e., the output circuit 260a may be the same as output circuits 260c or 260d). Next in block 320 a first output signal is generated by the output circuit. Similarly, in block 330 a second output signal is generated by the output circuit. For example, the first output signal may be a first quadrature signal (e.g., output signal Q in FIG. 1) and the second output signal may be a second quadrature signal (e.g., output signal QB in FIG. 1).

In an alternative embodiment, the output circuit (e.g., output circuit 260c, 260d) may be configured to receive the first clock signal. Thus, the frequency divider and the output circuit may be coupled as shown in FIG. 1 with an output circuit configured as shown in FIGS. 3 and 4 (i.e., the output circuit 260*b* may be the same as output circuits 260*c* or 260*d*). In such an embodiment, the first output signal may be a first in-phase signal (e.g., output signal I in FIG. 1) and the second output signal may be a second in-phase signal (e.g., output signal IB in FIG. 1).

In an embodiment, the output circuit (e.g., output circuit 260*c*, 260*d*), as previously disclosed, provides the functionality of two NAND gates while employing fewer transistors than a conventional output circuit comprising two conventional NAND gates, for example, an output circuit 150 as shown in FIG. 2. As such, reducing the number of transistors decreases the capacitive load on a clock buffer used to drive the circuit and subsequently reduces power consumption. Additionally, reducing the number of transistors reduces the average switching current of the output circuit. To further demonstrate the utility of the output circuit (e.g., output circuit 266*c*, 260*d*), suppose a quadrature generator 100 employing an output circuit comprising conventional NAND gates (e.g., output circuit 150 shown in FIG. 2) is compared to a quadrature generator 100 employing an output circuit 260*c* or 260*d*. Employing an output circuit 260*c* or 260*d* decreases the current drain about 3-4% and provides an output phase noise improvement of about 0.3 decibels (dB). Thus power consumption is reduced while maintaining approximately the same phase noise.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means +/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
a frequency divider comprising:
a first latch configured to receive a clock signal and a complement of the clock signal and to generate a first latch first output and a first latch second output; and
a second latch coupled to the first latch in a toggle-flop configuration, wherein the second latch is configured to receive the clock signal and the complement of the clock signal and to generate a second latch first output and a second latch second output;
a first output circuit comprising:
a first p-channel transistor, wherein a gate of the first p-channel transistor is configured to receive the clock signal;
a first n-channel transistor, wherein a gate of the first n-channel transistor is configured to receive the first latch first output;
a second n-channel transistor, wherein the second n-channel transistor is in series with the first p-channel transistor and the first n-channel transistor, and wherein a gate of the second n-channel transistor is configured to receive the clock signal;
a second p-channel transistor, wherein a gate of the second p-channel transistor is configured to receive the clock signal; and
a third n-channel transistor in series with the second p-channel transistor, wherein the second p-channel transistor and the third n-channel transistor are in parallel with the first p-channel transistor and the first n-channel transistor and wherein a gate of the third n-channel transistor is configured to receive the first latch second output; and
a second output circuit configured to receive the complement of the clock signal, the second latch first output, and the second latch second output;
wherein the first output circuit is configured to generate a first in-phase reference signal and a second in-phase reference signal and the second output circuit is configured to generate a first quadrature signal and a second quadrature signal.

2. The apparatus of claim 1, wherein a source of the first p-channel transistor is configured to connect a voltage supply, and wherein a drain of the first p-channel transistor is directly connected to a drain of the first n-channel transistor, wherein a source of the first n-channel transistor is directly connected to a drain of the second n-channel transistor and a source of the third n-channel transistor, wherein a source of the second n-channel transistor is configured to connect to a voltage supply ground, wherein a source of the second p-channel transistor is configured to connect to the voltage supply, and wherein a drain of the second p-channel transistor is directly connected to a drain of the third n-channel transistor.

3. The apparatus of claim 1, further comprising:
a first inverter directly connected to a drain of the first p-channel transistor, wherein an output of the first inverter is configured to generate the first in-phase reference signal; and
a second inverter directly connected to a drain of the second p-channel transistor, wherein an output of the second inverter is configured to generate the second in-phase reference signal.

4. The apparatus of claim 1, wherein the first output circuit further comprises:
a third p-channel transistor, wherein the gate of the third p-channel transistor is directly connected to the first latch first output, wherein a source of the third p-channel transistor is configured to connect to a voltage supply, and wherein a drain of the third p-channel transistor is directly connected to a drain of the first n-channel transistor; and
a fourth p-channel transistor, wherein a gate of the fourth p-channel transistor is directly connected to the first latch second output, wherein a source of the fourth p-channel transistor is configured to connect to the voltage supply, and wherein a drain of the fourth p-channel transistor is directly connected to a drain of the third n-channel transistor.

5. The apparatus of claim 4, further comprising:
a first inverter directly connected to the drain of the first p-channel transistor, wherein an output of the first inverter is configured to generate the first in-phase reference signal; and
a second inverter directly connected to the drain of the second p-channel transistor, wherein an output of the second inverter is configured to generate the second in-phase reference signal.

6. The apparatus of claim 3, wherein the second output circuit comprises:
a third p-channel transistor, wherein the gate of the third p-channel transistor is configured to receive the complement of the clock signal;
a fourth n-channel transistor, wherein the gate of the fourth n-channel transistor is configured to receive the second latch first output;
a fifth n-channel transistor, wherein the fifth n-channel transistor is in series with the third p-channel transistor and the fourth n-channel transistor and wherein the gate of the fifth n-channel transistor is configured to receive the complement of the clock signal;
a fourth p-channel transistor, wherein the gate of the fourth p-channel transistor is configured to receive the complement of the clock signal; and
a sixth n-channel transistor in series with the fourth p-channel transistor, wherein the fourth p-channel transistor and the sixth n-channel transistor are in parallel with the third p-channel transistor and the fourth n-channel transistor and wherein the gate of the sixth n-channel transistor is configured to receive the second latch second output.

7. The apparatus of claim 6, wherein a source of the third p-channel transistor is configured to connect to a voltage supply and a drain of the third p-channel transistor is directly connected to a drain of the fourth n-channel transistor; wherein a source of the fourth n-channel transistor is directly connected to a drain of the fifth n-channel transistor and a source of the sixth n-channel transistor; wherein a source of the fifth n-channel transistor is configured to receive a voltage supply ground; and wherein a source of the fourth p-channel transistor is configured to receive the voltage supply and a drain of the fourth p-channel transistor is directly connected to a drain of the sixth n-channel transistor.

8. The apparatus of claim 6, further comprising:
a third inverter directly connected to the drain of the third p-channel transistor, wherein the third inverter is configured to output the first quadrature signal; and
a fourth inverter directly connected to the drain of the fourth p-channel transistor, wherein the fourth inverter is configured to output the second quadrature signal.

9. The apparatus of claim 6, wherein the second output circuit further comprises:
a seventh p-channel transistor, wherein a gate of the seventh p-channel transistor is directly connected to the first output of the second latch, wherein a source of the seventh p-channel transistor is configured to connect to a voltage supply, and wherein a drain of the seventh p-channel transistor is directly connected to the drain of the fourth n-channel transistor; and
an eighth p-channel transistor, wherein the gate of the eighth p-channel transistor is directly connected to the second output of the second latch, wherein a source of the eighth p-channel transistor is configured to connect to the voltage supply, and wherein the drain of the eighth p-channel transistor is directly connected to the drain of the sixth n-channel transistor.

10. The apparatus of claim 9, further comprising:
a third inverter directly connected to the drain of the third p-channel transistor, wherein the third inverter is configured to output the first quadrature signal; and
a fourth inverter directly connected to the drain of the fourth p-channel transistor, wherein the fourth inverter is configured to output the second quadrature signal.

11. An apparatus comprising:
an output circuit comprising:
a first p-channel transistor, wherein a gate of the first p-channel transistor is configured to receive a clock signal;
a first n-channel transistor, wherein a drain of the first p-channel transistor is directly connected to a drain of the first n-channel transistor and wherein a gate of the first n-channel transistor is configured to receive a frequency divider first output signal;
a second n-channel transistor, wherein a drain of the second n-channel transistor is directly connected to a source of the first n-channel transistor and wherein a gate of the second n-channel transistor is configured to receive the clock signal;
a second p-channel transistor, wherein a gate of the second p-channel transistor is configured to receive the clock signal; and
a third n-channel transistor, wherein a drain of the second p-channel transistor is directly connected to a drain of the third n-channel transistor, wherein a source of the third n-channel transistor is directly connected to the source of the first n-channel transistor, and wherein a gate of the third n-channel transistor is configured to receive a frequency divider second output signal, wherein the output circuit is configured to generate a first in-phase reference signal and a second in-phase reference signal or a first quadrature signal and a second quadrature signal.

12. The apparatus of claim 11, wherein the output circuit further comprises:
a third p-channel transistor, wherein a gate of the third p-channel transistor is configured to receive the frequency divider first output signal, wherein a source of the third p-channel transistor is configured to connect to a voltage supply, and wherein a drain of the third p-channel transistor is directly connected to the drain of the first n-channel transistor; and
a fourth p-channel transistor, wherein a gate of the fourth p-channel transistor is configured to receive the frequency divider second output signal, wherein a source of the fourth p-channel transistor is configured to connect to the voltage supply, and wherein a drain of the fourth p-channel transistor is directly connected to the drain of the third n-channel transistor.

13. The apparatus of claim 11, further comprising:
a first inverter directly connected to the drain of the first p-channel transistor, wherein an output of the first inverter is configured to generate the first in-phase reference signal; and
a second inverter directly connected to the drain of the second p-channel transistor, wherein an output of the second inverter is configured to generate the second in-phase reference signal.

14. The apparatus of claim 11, further comprising:
a first inverter directly connected to the drain of the first p-channel transistor, wherein an output of the first inverter is configured to generate the first quadrature signal; and
a second inverter directly connected to the drain of the second p-channel transistor, wherein an output of the second inverter is configured to generate the second quadrature signal.

15. A method comprising:
receiving a clock signal by a frequency divider and an output circuit, wherein the frequency divider comprises a latch, wherein the latch receives the clock signal, and wherein the latch generates a first latch output signal and a second latch output signal;
generating a first output signal and second output signal, by the output circuit, based on the clock signal, the first latch output signal, and the second latch output signal, wherein the output circuit comprises:
a first p-channel transistor, wherein a gate of the first p-channel transistor is configured to receive the clock signal;
a first n-channel transistor, wherein a drain of the first p-channel transistor is directly connected to a drain of the first n-channel transistor, wherein a gate of the first n-channel transistor is configured to receive the first latch output signal;
a second n-channel transistor, wherein a gate of the second n-channel transistor is configured to receive the clock signal, and wherein a source of the first n-channel transistor is directly connected to a drain of the second n-channel transistor;
a second p-channel transistor, wherein a gate of the second p-channel transistor is configured to receive the clock signal;
a third n-channel transistor, wherein a drain of the second p-channel transistor is directly connected to a drain of the third n-channel transistor, wherein a source of the third n-channel transistor is directly connected to the source of the first n-channel transistor, and wherein a gate of the third n-channel transistor is configured to receive the second latch output signal;
a first inverter directly connected to the drain of the first p-channel transistor, wherein an output of the first inverter is configured to generate the first output signal; and
a second inverter directly connected to the drain of the second p-channel transistor, wherein an output of the second inverter is configured to generate the second output signal.

16. The method of claim 15, wherein the first output signal is a first in-phase reference signal and the second output signal is a second in-phase reference signal.

17. The method of claim 15, wherein the first output signal is a first quadrature signal and the second output signal is a second quadrature signal.

18. The method of claim 15, wherein the source of the first p-channel transistor is configured to connect to a voltage supply, wherein the source of the second n-channel transistor is configured to connect to a voltage supply ground, wherein the source of the second p-channel transistor is configured to connect to the voltage supply, and wherein the output circuit further comprises:
a third p-channel transistor, wherein the gate of the third p-channel transistor is configured to receive a frequency divider first output signal, wherein the source of the third p-channel transistor is configured to connect to the voltage supply, and wherein the drain of the third p-channel transistor is directly connected to the drain of the first n-channel transistor; and
a fourth p-channel transistor, wherein the gate of the fourth p-channel transistor is configured to receive a frequency divider second output signal, wherein the source of the fourth p-channel transistor is configured to connect to the voltage supply, and wherein the drain of the fourth p-channel transistor is directly connected to the drain of the third n-channel transistor.

19. The method of claim 18, wherein the first output signal is a first in-phase reference signal and the second output signal is a second in-phase reference signal.

20. The method of claim 18, wherein the first output signal is a first quadrature signal and the second output signal is a second quadrature signal.

* * * * *